INVENTOR.
JAMES R. KUBIK,
By L.E. Carnahan
AGENT.

INVENTOR.
JAMES R. KUBIK,
By L. E. Carnahan
AGENT.

1

3,462,832

PROCESS FOR FABRICATING HIGH DENSITY MULTILAYER ELECTRICAL INTERCONNECTIONS

James R. Kubik, Upland, Calif., assignor to General Dynamics Corporation, a corporation of Delaware Filed Oct. 24, 1966, Ser. No. 589,039
Int. Cl. B41m *3/08*; H05k *3/00*
U.S. Cl. 29—625 5 Claims

ABSTRACT OF THE DISCLOSURE

A method of making multilayer printed circuit boards having perpendicularly extending tube-like nickel interconnectors which are molecularly integral with associated interconnecting nickel plated circuits, the tube-like interconnectors being adapted to receive electronic component leads which may then be soldered or welded within the interconnectors.

Devices which serve as a media for attaching electronic components to a circuit in single or multilayer apparatus, such as 3-D module construction, are known. The end result of such devices is a series of circuits on at least one positioner or carrier board with tube-like elements at appropriate places in continuity with these circuits. The function of these tube-like elements is to receive electronic component leads so that they may be connected to the circuits as used in module construction, for example, U.S. Patent No. 3,209,066 exemplifies such known devices.

The present invention is an improvement of the manufacturing methods described and claimed in U.S. Patents Nos. 3,370,351 and 3,396,459, and assigned to the same assignee. This invention has for its purpose an improved methods of fabricating multilayer circuit boards incorporating high density tube-like elements, and has the following advantages: (1) The tube-like elements (unitubes) are fabricated as an integral part of the carrier board and are stronger units and will stand more abuse; (2) there is no chance of mismatch between the hole in the positioner board and the tube-like element as they are one and the same; (3) no "hard tooling" is necessary for limited production; (4) the tube-like element height is easily controlled; (5) the tube-like element diameters can be varied to accept different size component leads; and (6) provides high density packaging suitable for both soldering and welding techniques.

Therefore, it is an object of this invention to provide methods for fabricating high density multilayer electrical circuit boards.

Another object of the invention is to provide a method of fabricating circuit boards having high density tube-like elements formed therein.

Another object of the invention is to provide a method for fabricating high density electrical interconnection assemblies which produces ease of fabrication, improved registration and appearance, and lower manufacturing costs.

Other objects of the invention will become readily apparent from the following description and accompanying drawings wherein.

2

Figure 2:
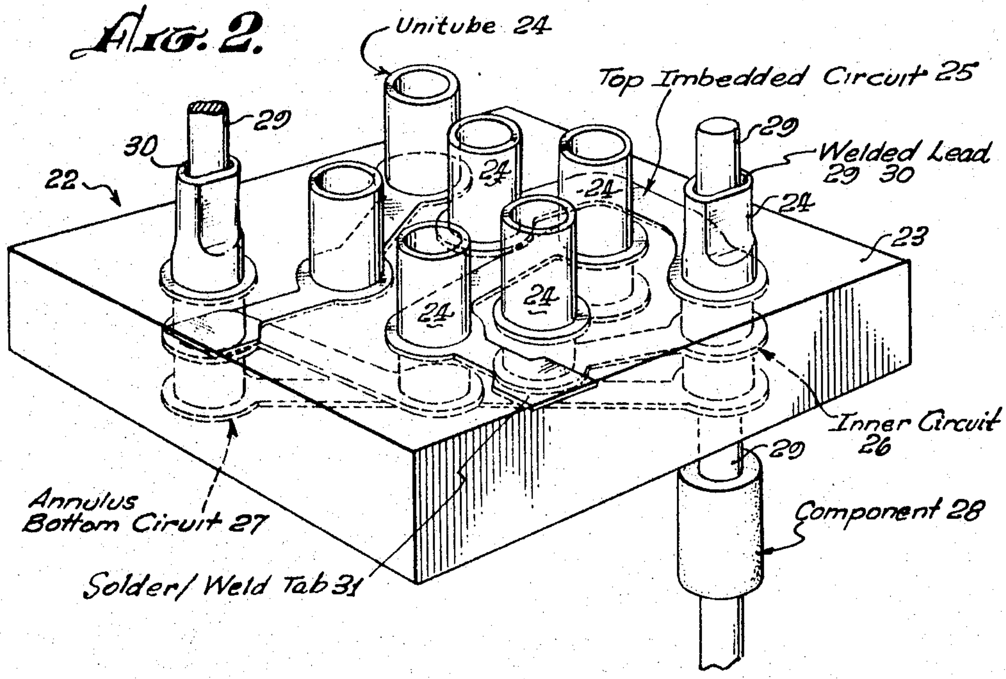
FIG. 2 is a perspective view of an embodiment of a circuit board made in accordance with the invention, the internal circuits being shown in phantom.
Figure 3:
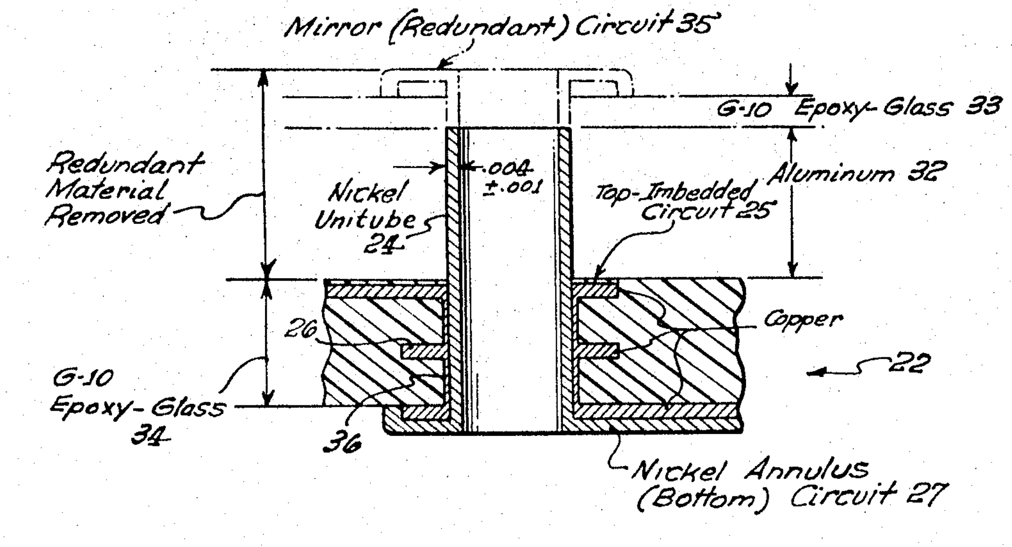

FIG. 3 is a cross-sectional view of a portion of the FIG. 2 embodiment showing a portion of the fabrication method therefor in phantom.

Figure 1:
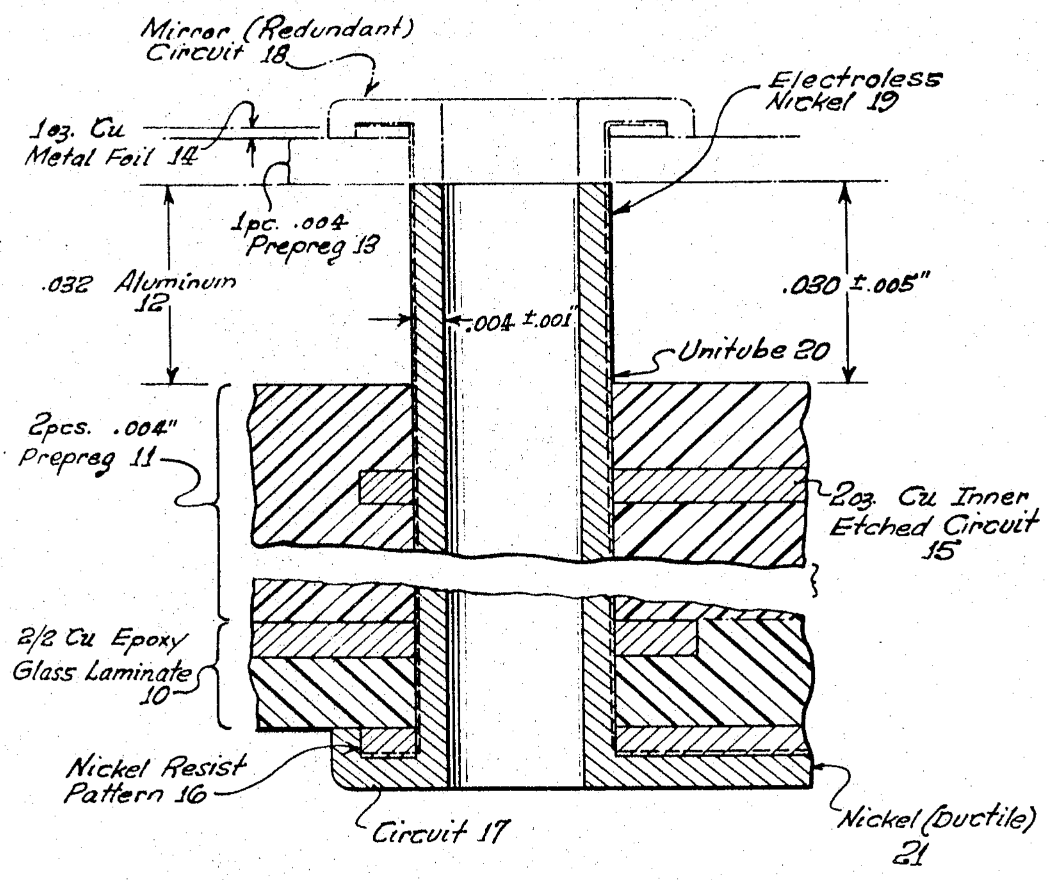
FIG. 1 is a cross-sectional view of an embodiment of a multilayer circuit board made in accordance with the invention and partially illustrating the fabrication method thereof.

Broadly, the invention relates to methods of producing multilayer printed circuit boards having molecularly integral tube-like elements extending perpendicularly away from the surface of the board. FIG. 1 embodiment illustrates an assembly or laminate formed by stacking epoxy-glass prepreg sheets, copper clad epoxy-glass laminates, and a sheet of aluminum. This assembly of sheets, which have been punched or drilled to provide suitable alignment registration holes, are then bonded together. The result is to provide a circuit panel having an external nickel circuit on one side, interconnected through the registration holes by a molecularly integral nickel tube-like element to all of the internal copper circuits. The nickel components are prepared by an electroless nickel plating step followed by a nickel electroplating step. The aluminum is chemically milled away so that the nickel plated through the hole stands up away from the circuit board as a tube-like element on the side opposite that of the external nickel circuit. The embodiment illustrated in FIGS. 2 and 3 differs in appearance from the FIG. 1 embodiment in that both sides of the circuit board are provided with external circuits, the newly added circuit being on the side from which the nickel tube-like elements extend, and being formed initially on the aluminum sheet prior to the stacking of the various component elements, during which assembly that circuit is pressed into the surface of the circuit board.

Referring now to the FIG. 1 embodiment and process for fabrication thereof, the invention provides a method of improving the tube-like element (unitube) fabrication of high density electronic circuit boards by ease of fabrication, improved registration and appearance, and lower manufacturing costs. This improved unitube circuit board fabrication procedure incorporates the following concepts:

(1) Complete photo engraving system for the highest definition and most precise registration (elimination of silk screening).

(2) Elimination of electroless copper and zincate processes.

(3) Elimination of subsequent electrolytic copper plating (cyanide and acid).

(4) Elimination of redrilling operations of plated unitube to meet specific unitube dimensions (with the use of electroless nickel).

(5) Incorporation of an all-nickel system eliminating acid etching undercutting to inner copper circuits.

The following description for producing the FIG. 1 embodiment will be set forth in five basic sections and with reference to FIG. 1.

(1) Preparation of circuit board laminate.

1.1 Cut 0.004 inch thick epoxy-glass prepreg, copper clad epoxy-glass laminates (2/2 or 2/1:0.0025 inch to 0.008 inch core) and 0.032 inch aluminum (grade 7075–T6) to size 6 inch by 9 inch or 9 inch by 12 inch.

1.2 Punch or drill registration holes.

1.3 Photo resist coat and photo engrave any required inner circuits on copper clad material, acid etch, clean and dry.

1.4 Assemble circuit board composite as follows:

1.4.1 For single layer:

1.4.1.1 2 oz. copper one side 0.0025–0.008 inch epoxy-glass laminate 10.

1.4.1.2 Epoxy-glass prepreg adhesive sheet 11.

1.4.1.3 0.032 inch aluminum sheet 12.

1.4.1.4 Epoxy-glass prepreg adhesive sheet 13.

1.4.1.5 1 oz. electrolytic copper metal foil 14 (copper oxide one side).

1.4.2 For multilayer:

1.4.2.1 Same as single layer except insert etched copper circuit layers 15 in desired order. Add required layers of prepreg between each inner circuit.

1.5 Place in lamination fixture (not shown) and bond at recommended temperature, pressure and time (for example, 325° F, 300 p.s.i. and 30 minutes).

1.6 Trim epoxy flash.

(2) Initial plating process (nickel resist circuit pattern).

2.1 Scrub, clean and dry laminate.

2.2 Photo resist coat and photo engrave by resist pattern 16, circuit 17 and mirror (redundant) image 18.

2.3 Nickel plate (sulfamate) approximately 10 minutes at 15–25 a.s.f. (amp./ft.$^2$).

2.4 Remove photo resist coat with stripper solvent.

(3) Drilling of circuit holes (unitube).

3.1 Mask exposed copper both sides of laminate with a maskant (strippable organic, pressure sensitive Teflon or Mylar tape, etc.).

3.2 Drill all inner-connect holes with carbide drills.

3.3 Deburr, sand, vapor hone or dry blast unitube holes and exposed aluminum surfaces.

(4) Final plating process.

4.1 Chemically clean.

4.2 Electroplate (sulfamate) nickel, 10 minutes at 15–20 a.s.f.

4.3 Water rinse.

4.4 Apply electroless nickel 19 to drilled unitube walls 20 (100–250 micro inches).

4.5 Cold water rinse and remove maskant.

4.6 Wet sand both sides with 280–400 grit paper.

4.7 Etch all exposed copper.

4.8 Water rinse.

4.9 Alkali rinse.

4.10 Activate in 50% HCl.

4.11 Water rinse.

4.12 Deionized water rinse.

4.13 Electroplate, nickel 21 for 5–8 hours at 25–30 a.s.f. which produces a unitube 20 with a wall thickness of, for example, 0.004±.001 inch.

4.14 Double water rinse and air dry.

(5) Stripping and finalization.

5.1 Grind off redundant nickel plated circuit 18.

5.2 Wet sand, #250 grit, aluminum surface and circuit side.

5.3 Particle blast (dry), aluminum surface and inside of unitube 19 to deburr.

5.4 Tape (lead) nickel circuit 16 side.

5.5 Chemically mill away aluminum 12.

5.6 Double water rinse.

5.7 Air blow dry.

5.8 Trim circuit board to size.

As shown in FIG. 1, the above-described fabrication process produces a multilayer circuit board having molecularly integral tube like elements (unitubes) extending perpendicularly away from the surface of the board for interconnection with the lead of a desired electronic component, the portions of FIG. 1 shown in phantom lines (prepreg 13, foil 14 and redundant circuit 18) being removed during the fabrication process.

Referring now to the embodiment of the invention illustrated in FIGS. 2 and 3, there is provided a high density multilayer electronic circuity unitube assembly with two external plated circuits and fabricated as set forth hereinafter, which provides the following advantages: (1) Higher density packaging; (2) adaptable to multi-multilayer stacking; (3) suitable for both soldering and welding techniques, and (4) lowers cost per each interconnect.

The completed multilayer circut board indicated generally at 22 and illustrated in FIG. 2, comprises a carrier or positioner board 23 which is provided with a plurality of tube-like members (unitubes) 24 extending from the upper surface thereof. Certain of the unitubes 24 are connected with a top-imbedded circuit 25, and/or an inner circuit 26, and/or an annulus bottom circuit 27. The unitubes 24 are connected to a component 28 by a lead 29 welded thereto as indicated at 30. In addition, if desired, the top circuit 25 may be connected to another circuit board or component by a soldered or welded tab as indicated at 31. The top circuit 25 may additionally function as a ground plane and can be designed to accept other welded or solded connections, if desired. Generally, but not limited to, this assembly may be made by the electro-deposition of nickel (sulfamate), although other electroplated or electroless finishes such as gold, tin/nickel, tin, solder, silver, rhodium, etc., can be applied to extend the versatility of the circuit board for special applications, such as flat packs, micro circuitry, etc.

Another advantage of the top circuit 25 is the reinforcement of the unitube and the minimizing of stresses caused by welding and fabrication which may create undiscernable discontinuity breaks to the intersecting internal layers and sever completely when subjected to qualifying environmental tests, this being more clearly illustrated by FIG. 3 and the sequence for fabrication thereof which is as follows:

1.1 Cut material: epoxy-glass prepeg, copper laminates, and 0.032 inch aluminum sheet such as 7075–T6 to standard size (e.g.; 6" x 9" or 9" x 12").

1.2 Punch or drill registration holes 1.3 Photoengrave and chemically etch required copper internal circuits 26 (utilizing epoxy-glass copper clad laminates).

1.4 Prepare top circuit 25 on aluminum sheet.

1.4.1 Zincate.

1.4.2 Preplate, copper cyanide.

1.4.3 Copper plate (acid).

1.4.4 Photo resist coat and photoengrave (or silk screen circuit pattern.

1.4.5 Nickel plate (sulfamate) 25 a.s.f. (amp./ft.$^2$) to 0.004–0.006 inch thickness.

As an alternate plating procedure.

1.4.5a Nickel plate or gold plate to 0.00005–0.0002 inch thickness.

1.4.6a Activate (50% HCl) 10–20 seconds.

1.4.7a Water rinse.

1.4.8a Copper plate (acid) 20–60 a.s.f., to copper plate thickness of 0.002 to 0.006 inch.

1.4.6 Remove photo resist or silk screen resist with stripper or MEK.

1.5 Assemble circuit board components in the following order on a metal lamination jig.

1.5.1 Copper epoxy-glass laminate 33 having for example, an 0.0025 inch core, and 2 oz. copper on one side to define redundant circuit 35.

1.5.2 Prepreg, 0.004 inch thickness.

1.5.3 Prepared aluminum panel 32 with top circuit 25.

1.5.4 Two sheets prepreg, 0.004 inch thickness.

1.5.5 Etched copper circuit or circuits 26 separated by 2 sheets of 0.004 inch prepreg.

1.5.6 Two sheets 0.004 inch prepreg.

1.5.7 Copper epoxy laminate 34 having, for example, an 0.0025 inch core and a 2 oz. copper layer on one side to define bottom circuit 27.

1.6 Bond at specific temperature, pressure, and time (e.g., 325° F., 300 p.s.i., and 30 minutes).

1.7 Remove epoxy resin flash.

1.8 Photo resist coat, photoengrave (or silk screen) and chemically etch bottom circuit 27 and redundant mirror image circuit 35.

1.9 Cover both etched circuits' sides with maskant (organic strippable, pressure sensitive tape) such as 0.002 inch thick Mylar tape.

2.0 Drill all required holes for unitubes 24 with carbide drills.
2.1 Mechanically and chemically clean drill unitube holes.
2.2 Zincate to inhibit aluminum activity.
2.3 Copper flash, copper cyanide, 20 a.s.f. for 2–3 minutes.
2.4 Copper plate (acid) 30 a.s.f. for 1 minute, 60 a.s.f. for 2 minutes.
2.5 Electroless copper plate on inside of plastic portions of unitube wall 24.
2.6 Remove maskant after electroless copper plating or after catalyst ($PdCl_2$) treatment and then finalize electroless deposition.
2.7 Copper plate (acid), 30 a.s.f. for 1 minute, 60 a.s.f. for 1 minute. (Plating of steps 2.3, 2.4, 2.5 and 2.7 produce copper layer 36 interconnecting circuits 25, 26, and 27 as shown in FIG. 3.)
2.8 Water rinse.
2.9 Sulfuric acid dip, 10%
3.0 Water rinse.
3.1 Deionize water rinse.
3.2 Nickel plate (sulfamate, 5–8 hours at 25–30 a.s.f.) to produce a thickness of 0.004±0.001 inch on unitube 24 wall and bottom circuit 27.
3.3 Grind off redundant plated circuit 35 removing the epoxy board 33 to the surface of aluminum sheet 32.
3.4 Wet sand and deburr.
3.5 Lead tape or mask with pressure sensitive adhesive circuit 27 side and chemically mill away aluminum sheet 32 with caustic (20–25%). Rinse.
3.6 Chemically etch off exposed copper on walls of unitubes 24 and/or other extraneous copper.
3.7 Water rinse.
3.8 Remove tape (maskant) from circuit 27.
3.9 Neutralization dip.
4.0 Water rinse.
4.1 HCl wash (10%).
4.2 Water rinse.
4.3 Lightly vapor hone unitubes and circuitry.
4.4 Water rinse.
4.5 Deionized water rinse.
4.6 Dry with filtered air blast.
4.7 Trim circuit boards to size.

Alternate methods of inhibiting aluminum activity may be accomplished by replacing steps 2.2 and 2.3 above by utilizing the known Alstan 70 process and the application of pyro phosphate copper as known in the art.

It has thus been shown that this invention provides an improved manner of fabricating high density multilayer circuit boards having electrical interconnects molecularly integral with the circuits thereon.

Although particular sequences for producing the illustrated embodiments have been described, modifications will become apparent to those skilled in the art, and it is intended to cover in the appended claims all such modifications as come within the true spirit and scope of the invention.

What I claim is:

1. A process for fabricating high density multilayer electrical interconnects molecularly integral with the circuit thereof comprising the steps of: photo resist coating and photoengraving desired circuit paths on certain of a plurality of copper clad layers of insulating material, placing a layer of epoxy-glass prepreg adhesive over each of said photoengraved copper clad layers as necessary to produce a desired thickness of said layers, placing a sheet of aluminum over said thickness of layers, placing a single layer of epoxy-glass prepreg adhesive over said sheet of aluminum, placing a sheet of copper foil over said single layer of epoxy-glass prepreg adhesive, laminating the thus assembled stack of layers and sheets at recommended temperature, pressure and time such that the formed circuit paths are located internally of said laminate, photo resist coating and photoengraving a circuit pattern on opposite external sides of said laminate such that the circuit pattern on the top portion of the laminates is a redundant image of the actual circuit pattern on the bottom portion of the laminate, nickel plating the circuit patterns to a predetermined thickness, drilling holes in the laminate at those places requiring an electrical interconnect, electroplating with nickel at least the surface areas of the drilled holes, applying electroless nickel to the surface areas of the drilled holes, activating in suitable acid solution, electroplating the circuit patterns and surface areas with nickel to the desired thickness, removing the circuit adjacent the aluminum sheet, taping the electroplated nickel areas, chemically removing the aluminum sheet, and cleaning and drying thereby producing a multilayer circuit board with electrical interconnects extending from one surface thereof and molecularly integral with the desired circuits therein.

2. The process defined in claim 1, wherein the step of drilling holes in the laminate is accomplished by: masking the exposed copper surfaces of the laminate with a maskant, drilling the holes with at least one carbide drill, and deburring, sanding, and honing the surface areas of the holes.

3. The process defined in claim 1, wherein the step of laminating is accomplished by: assembling a layer of epoxy-glass copper clad on one side to define the upper surface of the laminate a layer of epoxy-glass prepreg adhesive, a layer of aluminum having a circuit deposited on one side thereof, two layers of epoxy-glass prepreg adhesive, at least one layer of epoxy-glass having at least one side thereof copper clad, two layers of epoxy-glass prepreg adhesive, and a layer of epoxy-glass having one side clad with copper; to define the bottom surface of the laminate and bonding at recommended temperature, pressure and time.

4. The process defined in claim 3, additionally including the step of covering the upper and bottom surfaces of the laminate with a maskant prior to the step of drilling holes in the laminate, and the step of zincating the surface areas of the drilled holes to inhibit aluminum activity.

5. The process defined in claim 4, wherein the surface areas of the drilled holes are electroplated with copper, electroless plated with copper, and additionally including the steps of removing the maskant after the electroless plating step and electroplating with copper to a desired thickness prior to the step of activating.

References Cited

UNITED STATES PATENTS

| | | | |
|---|---|---|---|
| 3,102,213 | 8/1963 | Bedson et al. | 29—625 XR |
| 3,163,588 | 12/1964 | Shortt et al. | |
| 3,201,851 | 8/1965 | Stearn | 29—625 |
| 3,261,769 | 7/1966 | Coe et al. | |
| 3,317,966 | 4/1967 | Shaheen et al. | 29—625 |
| 3,345,749 | 10/1967 | Reimann | 174—68.5 |
| 3,348,990 | 10/1967 | Zimmerman et al. | 29—625 XR |
| 3,370,351 | 2/1968 | Freehauf et al. | 174—68.5 XR |

JOHN F. CAMPBELL, Primary Examiner

ROBERT W. CHURCH, Assistant Examiner

U.S. Cl. X.R.

29—626, 628; 117—212; 156—3; 174—68.5; 317—101; 204—9, 11, 25